(12) United States Patent
Oda et al.

(10) Patent No.: US 10,734,445 B2
(45) Date of Patent: Aug. 4, 2020

(54) STORAGE DEVICE (71) Applicant: TOSHIBA MEMORY CORPORATION, Minato-ku, Tokyo (JP)

(72) Inventors: Minoru Oda, Yokkaichi Mie (JP); Akira Yotsumoto, Yokkaichi Mie (JP); Kotaro Noda, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/910,786

(22) Filed: Mar. 2, 2018

(65) Prior Publication Data

US 2019/0088719 A1 Mar. 21, 2019

(30) Foreign Application Priority Data

Sep. 20, 2017 (JP) .................................. 2017-179788

(51) Int. Cl.
*H01L 29/786* (2006.01)
*H01L 27/24* (2006.01)
*H01L 23/528* (2006.01)
*H01L 29/66* (2006.01)
*H01L 29/45* (2006.01)
*H01L 21/768* (2006.01)
*H01L 21/311* (2006.01)
*H01L 29/06* (2006.01)

(52) U.S. Cl.
CPC ........ *H01L 27/2454* (2013.01); *H01L 23/528* (2013.01); *H01L 27/249* (2013.01); *H01L 29/45* (2013.01); *H01L 29/66742* (2013.01); *H01L 29/78642* (2013.01); *H01L 21/31116* (2013.01); *H01L 21/76802* (2013.01); *H01L 21/76843* (2013.01); *H01L 21/76877* (2013.01); *H01L 29/0676* (2013.01)

(58) Field of Classification Search
CPC ............... H01L 27/2454; H01L 27/249; H01L 27/11582; H01L 27/11578; H01L 27/1158; H01L 27/1157; H01L 27/11556; H01L 29/78642; H01L 29/7926; H01L 29/7889; H01L 29/41725; H01L 29/41766; H01L 29/41775; H01L 29/41741

See application file for complete search history.

(56) References Cited

U.S. PATENT DOCUMENTS

| 7,052,941 B2 * | 5/2006 | Lee ......................... B82Y 10/00 257/E27.026 |
| 7,910,994 B2 | 3/2011 | Yu et al. |

(Continued)

FOREIGN PATENT DOCUMENTS

JP 2007-123415 A 5/2007

*Primary Examiner* — Michael M Trinh
(74) *Attorney, Agent, or Firm* — Foley & Lardner LLP (57) ABSTRACT

A storage device including a transistor portion including a transistor, a plurality of interlayer insulating films provided above the transistor portion, a plurality of first conductive layers provided respectively between the plurality of interlayer insulating films, and a second conductive layer extending through the plurality of interlayer insulating films and the plurality of first conductive layers, the second conductive layer having one end electrically connected to the transistor portion, and a part that extends beyond a portion of the transistor portion.

7 Claims, 8 Drawing Sheets (56) References Cited

U.S. PATENT DOCUMENTS

| | | | |
|---|---|---|---|
| 9,275,729 B2 | 3/2016 | Ota et al. | |
| 9,287,499 B2 * | 3/2016 | Tajima | H01L 45/04 |
| 9,356,159 B2 | 5/2016 | Lee et al. | |
| 9,502,431 B2 | 11/2016 | Sakuma et al. | |
| 9,754,665 B2 * | 9/2017 | Chen | G11C 13/0007 |
| 2010/0117157 A1 | 5/2010 | Miyake | |
| 2010/0270593 A1 * | 10/2010 | Lung | H01L 27/101 |
| | | | 257/208 |
| 2015/0263074 A1 * | 9/2015 | Takaki | H01L 27/2481 |
| | | | 257/5 |

* cited by examiner

STORAGE DEVICE

CROSS-REFERENCE TO RELATED APPLICATION

This application is based on and claims the benefit of Japanese Patent Application No. 2017-179788, filed Sep. 20, 2017, the entire contents of which are incorporated herein by reference.

FIELD

Embodiments described herein relate generally to a storage device.

BACKGROUND

As a large-capacity nonvolatile memory, a two-terminal resistance change type memory can be implemented in place of a floating gate type NAND flash memory. With this type of memory, low voltage/low current operation, high speed switching, miniaturization and high integration of memory cells are possible.

In a large-capacity memory array, a large number of metal wirings called bit lines and word lines are arranged in a crossing manner, and a memory cell is formed at the intersection of each bit line and each word line. Writing to one memory cell is performed by applying voltage to the bit line BL and the word line WL connected to the memory cell.

DETAILED DESCRIPTION

An example embodiment provides for a storage device with reduced contact resistance.

As used herein, description of a first component or part being "provided below" a second component or part can refer to a positional relationship in which the first component or part is provided under the second component or part, or to a positional relationship in which the first component or part is provided at, or extends to, a lower position than that of the second component or part. Description of a first component or part being "provided above" a second component or part can refer to a positional relationship in which the first component or part is provided on top of the second component or part, or to a positional relationship in which the first component or part is provided at, or extends to, a higher position than that of the second component or part.

In general, according to one or more embodiments, a storage device includes: a transistor portion including a transistor; a plurality of interlayer insulating films provided above the transistor portion; a plurality of first conductive layers provided respectively between the plurality of interlayer insulating films; and a second conductive layer extending through the plurality of interlayer insulating films and the plurality of first conductive layers, the second conductive layer having a first end electrically connected to the transistor portion, and a part that extends beyond a portion of the transistor portion.

Embodiments will be described below using the accompanying drawings. It is noted that in the drawings, same reference numerals may be assigned to identical or similar parts.

In order to represent the positional relationship between parts and the like herein, the upward direction in the drawings is described as "upper", and the downward direction in the drawing as "lower". The concept of "upper" and "lower" herein is not necessarily a term representing a relationship with a direction of gravity. Orientations other than those shown in the drawings may be implemented, as appropriate.

First Aspect

According to the first aspect, in one or more embodiments a storage device includes: a transistor portion including a transistor; a plurality of interlayer insulating films provided above the transistor portion; a plurality of first conductive layers provided respectively between the plurality of interlayer insulating films; and a second conductive layer penetrating the plurality of interlayer insulating films and the plurality of first conductive layers, one end of which is electrically connected to the transistor portion, and a part of which extends beyond a part of the transistor portion.

Figure 1:
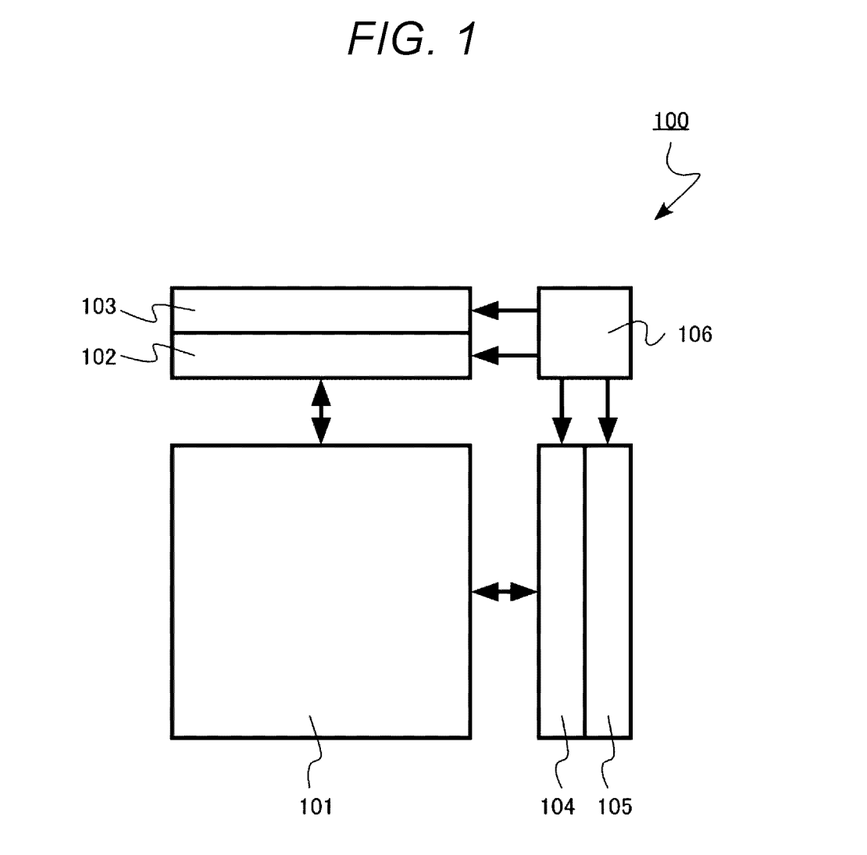
FIG. 1 is a block diagram of a storage device according to a first aspect.
Figure 2:
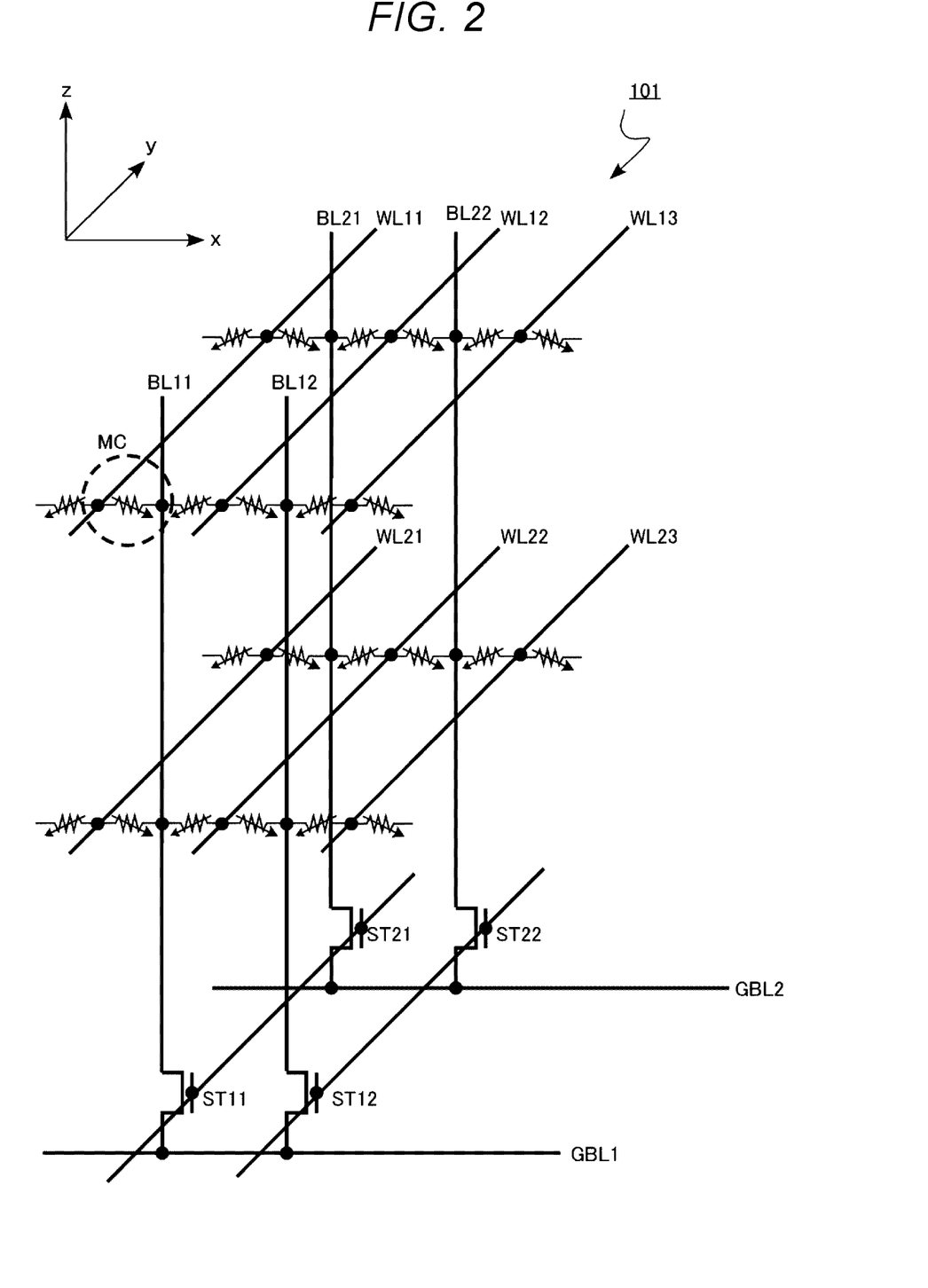
FIG. 2 is an equivalent circuit diagram of a memory cell array of the storage device according to the first aspect.

FIG. 1 is a block diagram of one or more embodiments of a storage device according to the first aspect. FIG. 2 is an equivalent circuit diagram of a memory cell array 101. FIG. 2 schematically shows a wiring structure in the memory cell array.

A storage device 100 shown in FIG. 1 can be a phase change memory. The phase change memory stores data by utilizing a resistance change accompanying a change of a crystal structure of a variable resistance layer.

Further, the memory cell array 101 shown in FIG. 1 can have a three-dimensional structure in which memory cells are three-dimensionally arranged. With a three-dimensional structure, a degree of integration of the storage device 100 is improved.

As shown in FIG. 1, the storage device 100 includes the memory cell array 101, a word line driver circuit 102, a row decoder circuit 103, a sense amplifier circuit 104, a column decoder circuit 105 and a control circuit 106.

Further, as shown in FIG. 2, a plurality of memory cells MC are three-dimensionally arranged in the memory cell array 101. In FIG. 2, a region surrounded by a broken line corresponds to one memory cell MC.

The memory cell array 101 includes a plurality of word lines WL (e.g. WL 11, WL 12, WL 13, WL 21, WL 22, WL 23) and a plurality of bit lines BL (e.g. BL 11, BL 12, BL 21, BL 22). Each word line WL extends in the y direction. Each bit line BL extends in the z direction. Each word line WL and each bit line BL perpendicularly, or almost perpendicularly, cross each other. A memory cell MC is disposed at the intersection of each word line WL and each bit line BL.

Hereinafter, the word line WL 11, the word line WL 21, or the like may be collectively referred to herein as a word line WL. In addition, the bit line BL 11, the bit line BL 21, the bit line BL 12 or the like may be collectively referred to herein as a bit line BL.

The word lines WL can include conductive layers. The word lines WL are, for example, metal layers. Each word line WL contains, for example, tungsten, titanium nitride or copper. Each word line WL may be made of another metal or alloy, a metal semiconductor compound or a conductive material such as a semiconductor.

The bit lines BL can include conductive layers. The bit lines BL are, for example, metal layers. Each bit line BL contains, for example, tungsten, titanium nitride or copper. Each bit line BL may be made of another metal or alloy, a metal semiconductor compound or a conductive material such as a semiconductor.

A pitch of the word lines WL in the x direction is, for example, about 50 nanometers (nm) or more and about 200 nm or less. The thickness of a word line WL in the z direction is, for example, about 30 nm or less (e.g. about 28 nm or less, about 26 nm or less, or about 24 nm or less). A pitch of the bit lines BL in the x direction is, for example, about 50 nm or more and about 200 nm or less.

The pitch of the word lines WL in the x direction, the thickness of a word line WL in the z direction, and the pitch of the bit lines BL in the x direction can be measured, for example, by observation with a transmission electron microscope.

The x direction may be referred to herein as a first direction, the y direction is one example of a direction perpendicular to the x direction, and the z direction is one example of a direction perpendicular to the x direction and the y direction and may be referred to herein as the second direction.

The plurality of word lines WL (which may be referred to herein as first conductive layers) are electrically connected to a row decoder circuit 103. The plurality of bit lines BL are connected to a sense amplifier circuit 104. Select transistors ST (ST11, ST21, ST12, ST22) and global bit lines (which may be referred to herein as overall conductive layers) GBL (e.g. GBL1, GBL2) are provided between the plurality of bit lines (which may be referred to herein as second conductive layers or local conductive layers) BL and the sense amplifier circuit 104.

The row decoder circuit 103 has a function of selecting a word line WL according to an input or received row address signal. The word line driver circuit 102 has a function of applying a predetermined voltage to the word line WL selected by the row decoder circuit 103.

The column decoder circuit 105 has a function of selecting a bit line BL according to an input or received column address signal. The sense amplifier circuit 104 has a function of applying a predetermined voltage to the bit line BL selected by the column decoder circuit 105. Further, the sense amplifier circuit 104 has a function of detecting and amplifying current flowing between the selected word line WL and the selected bit line BL.

The control circuit 106 has functions of controlling the word line driver circuit 102, the row decoder circuit 103, the sense amplifier circuit 104, the column decoder circuit 105 and other circuits not shown.

Such a circuit as the word line driver circuit 102, the row decoder circuit 103, the sense amplifier circuit 104, the column decoder circuit 105 and the control circuit 106 is an electronic circuits. Such a circuit is configured with, for example, a wiring layer and a transistor using a semiconductor layer, not shown.

Figure 3A:
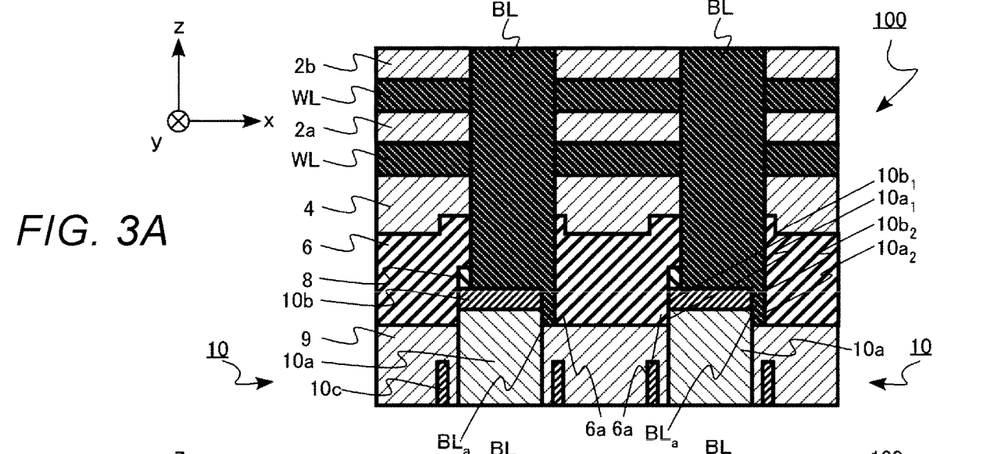
FIG. 3A shows an explanatory view of a main part of a storage device according to the first aspect in which a part of a second insulating film is provided below a first barrier metal layer.
Figure 3B:
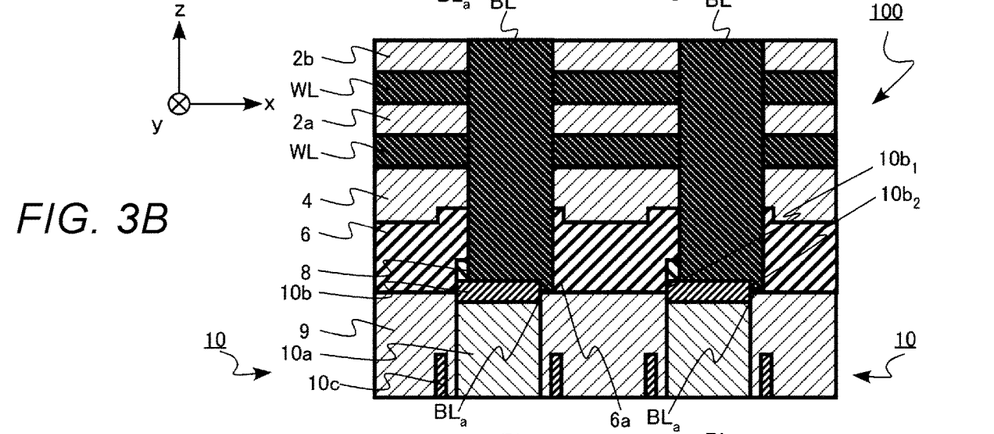
FIG. 3B shows an explanatory view in which the part of the second insulating film is provided above a first transistor and below a part of the first barrier metal layer 10b.
Figure 3C:
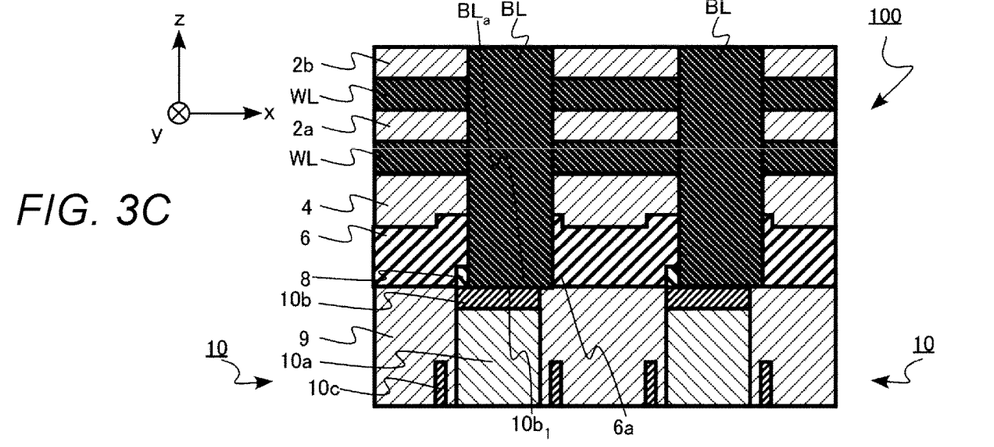
FIG. 3C shows an explanatory view in which the part of the second insulating film is provided above the first barrier metal layer, and a part of a bit line is in contact with an upper surface of the first barrier metal layer.

FIGS. 3A-3C are explanatory views showing a cross-sectional view of a main part of the storage device 100, FIG. 3A showing an explanatory view in which a part 6a of a second insulating film is provided below a first barrier metal layer 10b, FIG. 3B showing an explanatory view in which the part 6a of the second insulating film is provided above a first transistor 10a and below a part of the first barrier metal layer 10b, FIG. 3C showing an explanatory view in which the part 6a of the second insulating film is provided above the first barrier metal layer 10b, and a part $BL_a$ of a bit line is in contact with an upper surface $10b_1$ of the first barrier metal layer 10b.

A first transistor portion 10 includes the first transistor 10a and the first barrier metal layer 10b provided on the first transistor 10a. A gate electrode 10c functions as a gate electrode of the first transistor 10a.

The first transistor 10a is a select transistor ST. The select transistor ST is, for example, a vertical TFT (thin film transistor).

A plurality of interlayer insulating films 2 (e.g. interlayer insulating film 2a and interlayer insulating film 2b) are provided above the first transistor portion 10. The plurality of interlayer insulating films 2 extend in the x direction.

The plurality of word lines WL are provided respectively between the plurality of interlayer insulating films 2. The plurality of word lines WL extend in the y direction.

Each bit line BL penetrates the plurality of interlayer insulating films 2 and the plurality of word lines WL. The bit line BL extends in the z direction. One end of the bit line BL is electrically connected to the first transistor portion 10 via the first barrier metal layer 10b (e.g. the one end of the bit line BL is in contact with the first barrier metal layer 10b), the first transistor 10a, or both the first barrier metal layer 10b and the first transistor 10a.

A memory cell MC, not shown, is provided at the intersection of each bit line BL and each word line WL.

A first insulating film 4 is provided between the plurality of interlayer insulating films 2 and the plurality of word lines WL, and the first transistor portion 10. The first insulating film 4 contains, for example, silicon oxide.

A second insulating film 6 is provided between the first insulating film 4 and the first transistor portion 10. An etching rate of the second insulating film 6 is lower than that of the first insulating film 4. The second insulating film 6 contains silicon nitride, titanium oxide, aluminum oxide or tantalum oxide.

A third insulating film 9 is provided around the first transistor portion 10. The third insulating film 9 contains, for example, silicon oxide.

The first barrier metal layer 10b is provided between the first transistor 10a and the plurality of interlayer insulating films 2.

In some embodiments a part 6a of the second insulating film 6 is provided below or extends beyond a part of the first transistor portion 10. For example, as shown in FIG. 3A, the part 6a of the second insulating film is provided below the first barrier metal layer 10b (a part of the first transistor portion 10), and is in contact with a side surface $10a_1$ of the first transistor 10a and a side surface $10b_2$ of the first barrier metal layer 10b. The first barrier metal layer 10b may have a first side in contact with the bit line BL and a second side opposite to the first side. The bit line BL may include a part 6a that extends beyond the second side of the first metal barrier layer 10b.

Further, as shown in FIG. 3B, the part 6a of the second insulating film 6 may be provided above the first transistor 10a, may be provided below a part of the first barrier metal layer 10b, and may be in contact with the side surface $10b_2$ of the first barrier metal layer 10b. The first barrier metal layer 10b may have a first side (e.g. an upper surface $10b_1$) in contact with the bit line BL and a second side opposite to the first side. The bit line BL may include a part 6a that extends beyond the first side of the first metal barrier layer 10b, and does not extend beyond the second side of the first metal barrier layer 10b.

In some embodiments a part $BL_a$ of the bit line BL is provided below a part of the first transistor 10a. For example, as shown in FIG. 3A, the part $BL_a$ of the bit line BL is provided below the first barrier metal layer 10b, and in contact with a side surface $10b_2$ of the first barrier metal layer 10b and a side surface $10a_2$ (e.g. a side surface $10a_2$ opposite to the side surface $10a_1$) of the first transistor 10a.

Further, in some embodiments, as shown in FIG. 3B, the part $BL_a$ of the bit line BL is provided below a part of the first barrier metal layer 10b (upper surface $10b_1$ of the first barrier metal layer 10b), and in contact with a side surface $10b_2$ of the first barrier metal layer 10b.

Further, as shown in FIG. 3C, the part $BL_a$ of the bit line BL may be in contact with the part of the first barrier metal layer 10b (the upper surface $10b_1$ of the first barrier metal layer 10b). In some embodiments the bit line BL does not extend beyond the upper surface $10b_1$ of the first barrier metal layer 10b.

The third insulating film 8 is provided between the first transistor portion 10 and the second insulating film 6. The etching rate of the third insulating film 8 is lower than that of the first insulating film 4. The third insulating film 8 contains silicon nitride, titanium oxide, aluminum oxide or tantalum oxide.

It is noted that the first barrier metal layer 10b and the third insulating film 8 may be omitted.

FIGS. 4A, 4B, 4C and 4D are schematic cross-sectional views illustrating the storage device 100 during manufacture according to one or more embodiments of a method of manufacturing the storage device 100.

Figure 4A:
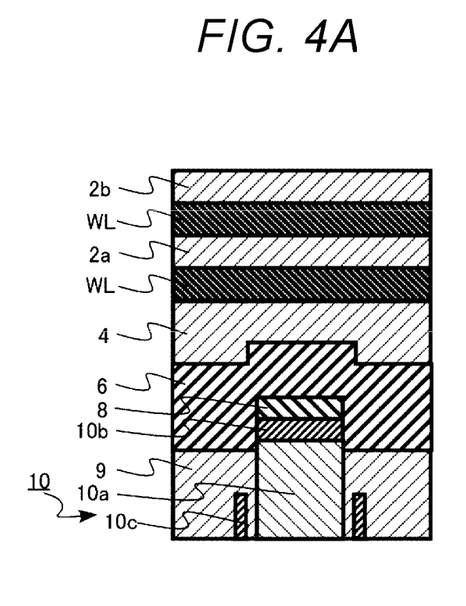
FIGS. 4A, 4B, 4C and 4D are schematic cross-sectional views illustrating the storage device during manufacture according to a method of manufacturing the storage device of the first aspect.

First, the first transistor portion 10 including the first transistor 10a and the first barrier metal layer 10b is provided.

Next, the third insulating film 8 is formed on the first transistor portion 10. Next, the second insulating film 6 is formed on the third insulating film 8. Next, the first insulating film 4 is formed on the second insulating film 6. Next, a plurality of interlayer insulating films 2 and a plurality of word lines WL provided respectively between the plurality of interlayer insulating films 2 are formed on the first insulating film 4 (FIG. 4A).

Figure 4B:
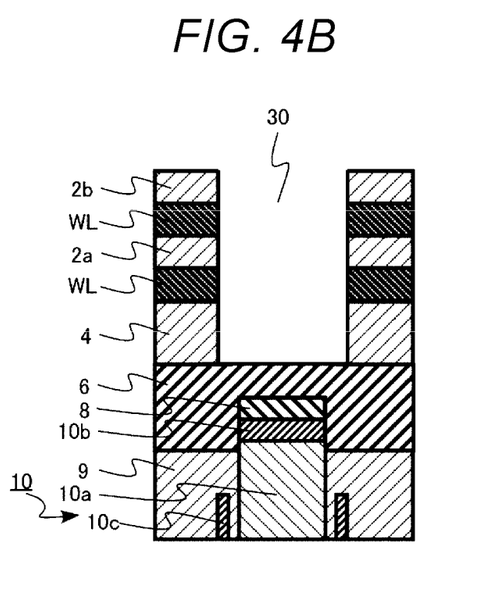

Next, a hole 30 penetrating and defined by the plurality of interlayer insulating films 2, the plurality of word lines WL and the first insulating film 4 is formed by, for example, dry etching (FIG. 4B).

Figure 4C:
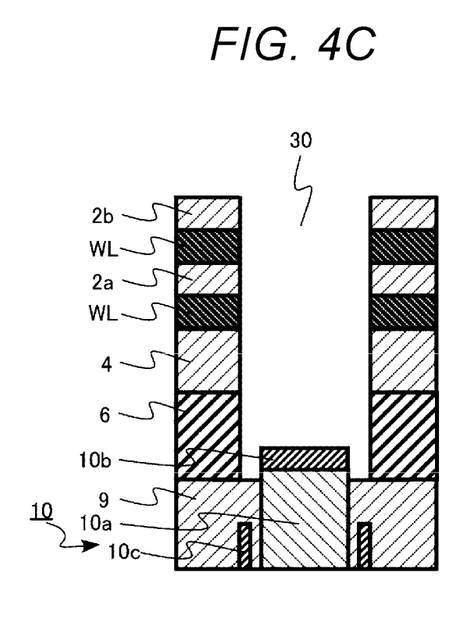

Next, the hole 30 is formed so as to further penetrate the second insulating film 6 such that the first barrier metal layer 10b and a part of the first transistor 10a (e.g. a portion of a sidewall of the first transistor 10a) are exposed (FIG. 4C).

Figure 4D:
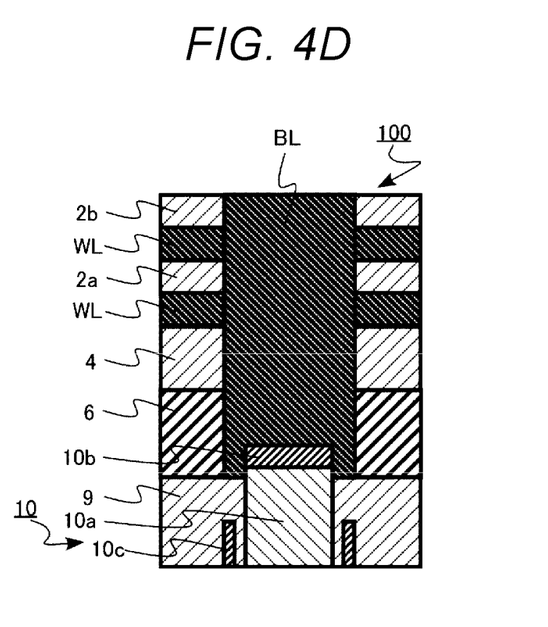

Next, a bit line BL is formed in the hole 30 so that a part of the bit line BL is in contact with the first barrier metal layer 10b and the first transistor 10a (FIG. 4D).

Next, the operational effects of one or more embodiments will be described.

According to one or more embodiment described herein, a part $BL_a$ of the bit line is provided below the transistor portion 10. Therefore, the electrical connection with the bit line BL is established via the side surface $10b_2$ of the first barrier metal layer 10b and the side surface $10a_2$ of the first transistor 10a. Therefore, contact resistance between the bit line BL and the first transistor 10a can be reduced.

In particular, when misalignment occurs between the bit line BL and the first transistor 10a, it can be difficult to successfully establish the electrical connection between the bit line BL and the first transistor 10a. In the storage device of one or more embodiments described herein, it is possible to electrically connect the bit line BL and the first transistor 10a via the side surface $10b_2$ of the first barrier metal layer 10b and the side surface $10a_2$ of the first transistor 10a. Therefore, even if misalignment occurs, a favorable electrical connection between the bit line BL and the first transistor 10a can be obtained.

The second insulating film 6 provided between the first insulating film 4 and the first transistor portion 10 and having an etching rate slower than that of the first insulating film 4 is provided below a part of the first transistor portion 10, thus, facilitating manufacturing in which the hole 30 penetrating the first insulating film 4 is formed first (FIG. 4B), and then subsequently the hole 30 is made to penetrate the second insulating film 6 (FIG. 4C). Therefore, formation of the bit line BL in the storage device is facilitated.

Silicon nitride, titanium oxide, aluminum oxide or tantalum oxide can be used as the second insulating film, which can provide for a lower etching rate than that of the silicon oxide.

Since the first transistor portion 10 includes the first barrier metal layer 10b, more favorable electrical connection can be obtained.

A part of the bit line BL is provided below a part of the first barrier metal layer 10b, thus, the electrical connection between the bit line BL and the first transistor 10a is established not only through the upper surface $10b_1$ of the first barrier metal layer 10b, but also through the side surface $10b_2$ of the first barrier metal layer 10b and the side surface $10a_2$ of the first transistor 10a. Therefore, it is possible to provide a storage device with reduced contact resistance.

A part of the second insulating film 6 is provided below the part of the first barrier metal layer 10b, thus, facilitating manufacturing the storage device in which the bit line BL and the first transistor 10a are electrically connected through the side surface $10b_2$ of the first barrier metal layer 10b and the side surface $10a_2$ of the first transistor 10a.

According to one or more embodiments described herein, it is possible to provide a storage device with reduced contact resistance.

Second Aspect

According to the second aspect, in one or more embodiments, a storage device includes: a first overall conductive layer extending in a first direction; a second overall conductive layer extending in the first direction; a first local conductive layer extending in a second direction crossing the first direction; a second local conductive layer extending in the second direction; a first transistor portion including a first transistor, and provided between the first overall conductive layer and the first local conductive layer; a second transistor portion including a second transistor, and provided between the second overall conductive layer and the second local conductive layer; a first transistor electrode portion provided between the first local conductive layer and the first transistor portion; and a second transistor electrode portion provided between the second local conductive layer and the second transistor portion, wherein the first transistor electrode portion includes a first polycrystalline silicon portion including polycrystalline silicon, a first silicide portion including silicide and provided between the first polycrystalline silicon portion and the first local conductive layer, a second silicide portion including silicide and provided between the first polycrystalline silicon portion and the second transistor electrode portion, and a third silicide portion including silicide and provided on a side of the first polycrystalline silicon portion opposite to the second silicide portion. Here, some redundant description overlapping with the first aspect will be omitted.

Figure 5A:
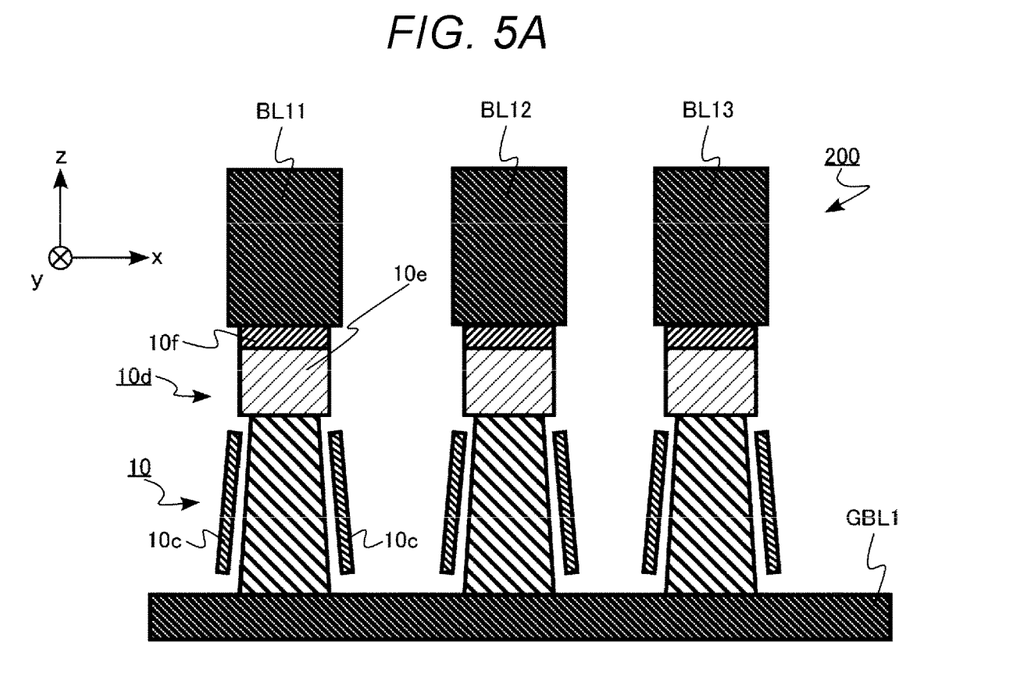
FIG. 5A shows a schematic cross-sectional view of an xz plane of a main part of a storage device according to a second aspect.
Figure 5B:
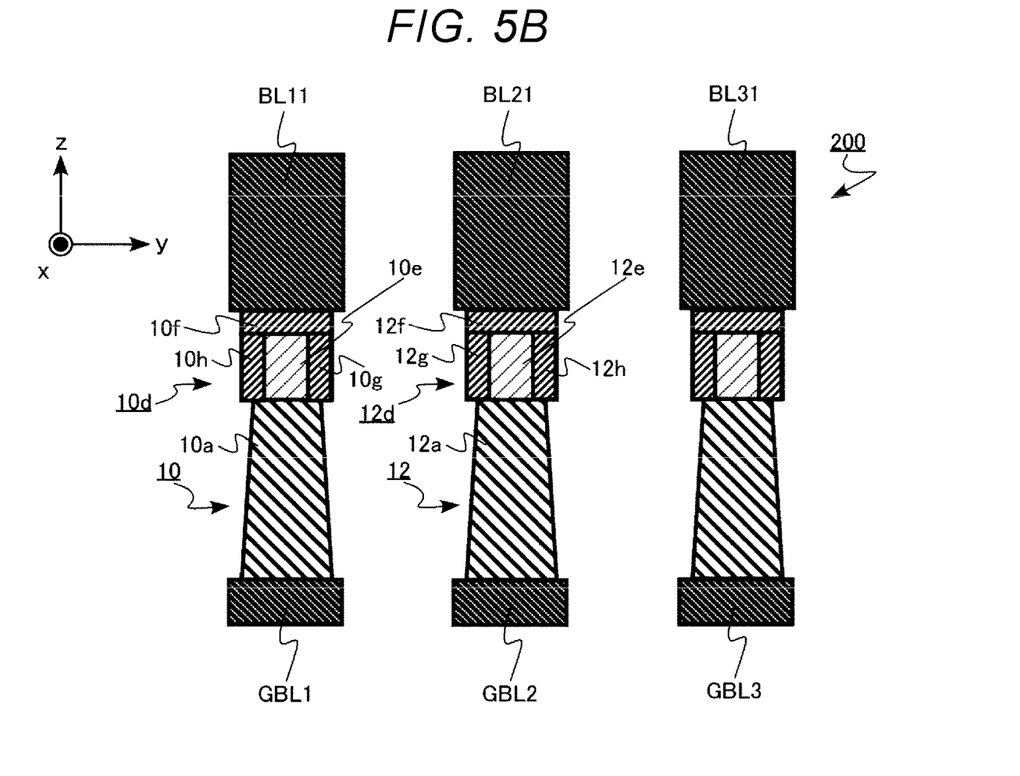
FIG. 5B shows a schematic cross-sectional view of an yz plane of a main part of a storage device according to a second aspect.

FIGS. 5A-5B are schematic cross-sectional views of a main part of a storage device 200 according to one or more embodiments, FIG. 5A showing a schematic cross-sectional view of the xz plane, FIG. 5B showing a schematic cross-sectional view of the yz plane.

A global bit line GBL1 (first overall conductive layer) extends in the x direction. A global bit line GBL2 (second overall conductive layer) extends in the x direction. A global bit line GBL3 (third overall conductive layer) extends in the x direction.

A bit line BL11 (first local conductive layer) extends in the z direction. A bit line BL21 (second local conductive layer) extends in the z direction. A bit line BL13 extends in the z direction.

The first transistor portion 10 is provided between the global bit line GBL1 and the bit line BL11.

The first transistor portion 10 includes a first transistor 10a. A gate electrode 10c functions as a gate electrode of the first transistor 10a.

A second transistor portion 12 is provided between the global bit line GBL2 and the bit line BL21.

The second transistor portion 12 includes a second transistor 12a.

A first transistor electrode portion 10d is provided between the bit line BL11 and the first transistor portion 10.

A second transistor electrode portion 12d is provided between the bit line BL21 and the second transistor portion 12.

The first transistor electrode portion 10d may be a part of the first transistor 10a, for example, a part of a source, a part of a drain, a part of an emitter or a part of a collector. In addition, the first transistor electrode portion 10d may be provided separately from a third transistor 14a.

It is noted that a barrier metal layer, not shown, may be provided between the first transistor electrode portion 10d and the bit line BL11.

The second transistor electrode portion 12d may be a part of the second transistor 12a, for example, a part of a source, a part of a drain, a part of an emitter or a part of a collector. In addition, the second transistor electrode portion 12d may be provided separately from the second transistor 12a.

It is noted that a barrier metal layer, not shown, may be provided between the second transistor electrode portion 12d and the bit line BL21.

The first transistor electrode portion 10d includes a first polycrystalline silicon portion 10e including polycrystalline silicon, a first silicide portion 10f including silicide, and provided between the first polycrystalline silicon portion 10e and the bit line BL11, a second silicide portion 10g including silicide, and provided between the first polycrystalline silicon portion 10e and the second transistor electrode portion 12d, and a third silicide portion 10h including silicide, and provided on a side first polycrystalline silicon portion 10e opposite to the second silicide portion 10g.

The second transistor electrode portion 12d includes a second polycrystalline silicon portion 12e including polycrystalline silicon, a silicide portion 12f including silicide, and provided between the second polycrystalline silicon portion 12e and the bit line BL21, a silicide portion 12g including silicide, and provided between the second polycrystalline silicon portion 12e and the first transistor electrode portion 10d, and a silicide portion 12h including silicide, and provided on a side of the second polycrystalline silicon portion 12e opposite to the silicide portion 12g.

Figure 6A:
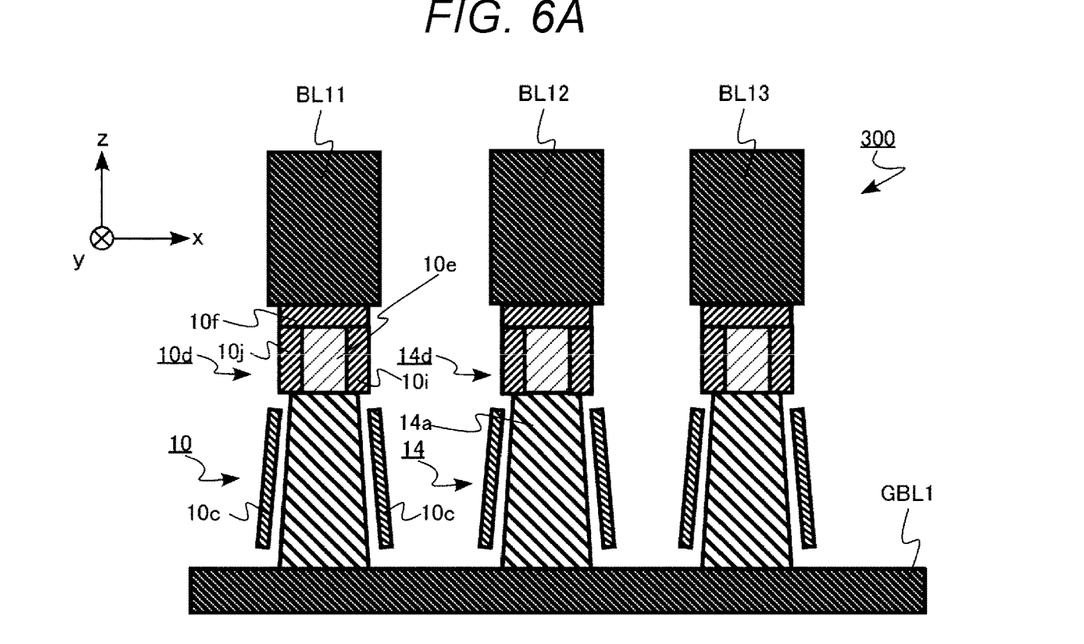
FIG. 6A shows a schematic cross-sectional view of an xz plane of another embodiment of a main part of a storage device according to the second aspect.
Figure 6B:
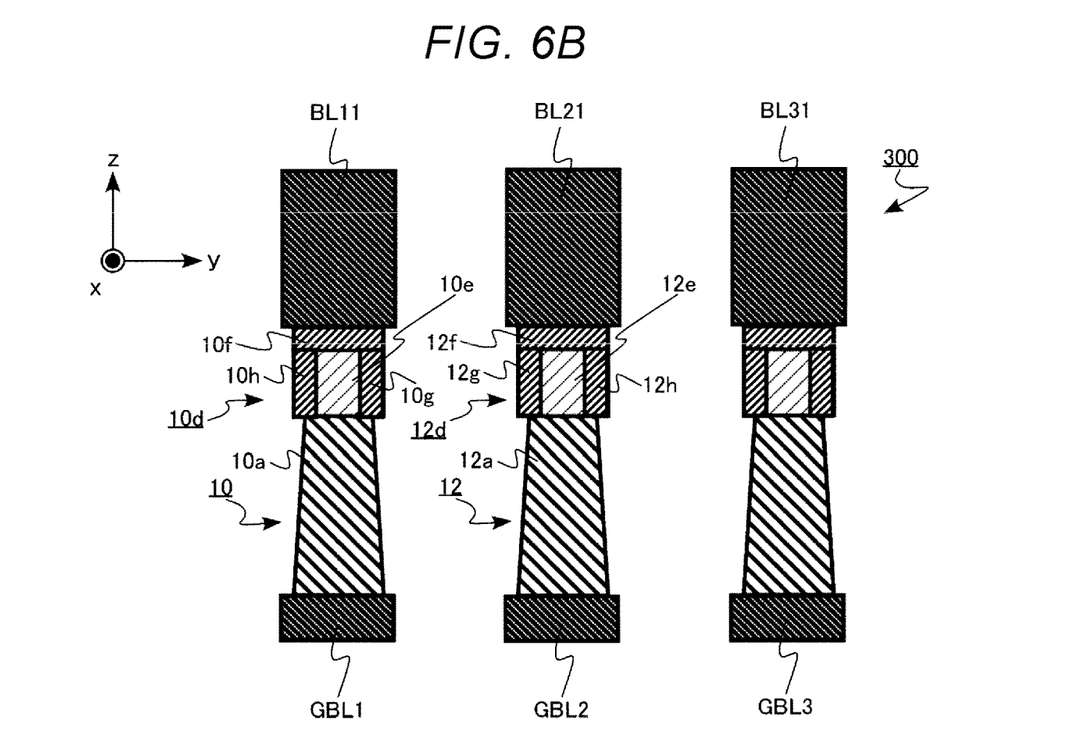
FIG. 6B shows a schematic cross-sectional view of an yz plane of another embodiment of a main part of a storage device according to the second aspect.

FIGS. 6A-6B are schematic cross-sectional views of a main part of a storage device 300 according to another embodiment, FIG. 6A showing a schematic cross-sectional view of the xz plane, FIG. 6B showing a schematic cross-sectional view of the yz plane.

A bit line BL12 (third local conductive layer) extends in the z direction.

The third transistor portion 14 is provided between the global bit line GBL1 and the bit line BL12.

A third transistor electrode portion 14d is provided between the bit line BL12 and the third transistor portion 14.

The third transistor portion 14 includes a third transistor 14a.

The third transistor electrode portion 14d may be a part of the third transistor 14a, for example, a part of a source, a part of a drain, a part of an emitter or a part of a collector. In addition, the third transistor electrode portion 14d may be provided separately from a third transistor 14a.

The first transistor electrode portion 10d further includes a fourth silicide portion 10i provided between the first polycrystalline silicon portion 10e and the third transistor electrode portion 14d, and a fifth silicide portion 10j including silicide, and provided on a side of the first polycrystalline silicon portion 10e opposite to the fourth silicide portion 10i of.

The silicide of the storage device is, for example, metal silicide. The silicide of the storage device of the embodiment shown is, for example, molybdenum silicide, tungsten silicide, titanium silicide, cobalt silicide or nickel silicide.

The silicide portion in the storage device can be formed by a known silicide formation process.

According to the storage device of the presently described embodiment, the electrical connection between the bit line BL and the transistor is further improved by the silicide portion (the first silicide portion 10f, the second silicide portion 10g, the third silicide portion 10h, the fourth silicide portion 10i, the fifth silicide portion 10j and the sixth silicide portion 10k) formed around the first polycrystalline silicon portion 10e. Therefore, it is possible to provide a storage device with reduced contact resistance.

In particular, when the bit line BL is misaligned with respect to the transistor, the electrical connection between the bit line BL and the transistor portion is established by the silicide portion formed around the first polycrystalline silicon portion 10e, which offers an advantage.

The storage device 200 shown in FIG. 5 is different from the storage device 300 shown in FIG. 6 in that the fourth silicide portion 10i and the fifth silicide portion 10j are not provided in the storage device 200. When the fourth silicide portion 10i and the fifth silicide portion 10j are provided in the vicinity of the gate electrode 10c, the bit line BL and the gate electrode 10c may be electrically connected by the fourth silicide portion 10i and the fifth silicide portion 10j. When fourth silicide portion 10i and the fifth silicide portion 10j are omitted, it can be difficult to establish electrical contact between the bit line BL and the gate electrode 10c.

On the other hand, as compared with the storage device 200 shown in FIG. 5, the storage device 300 shown in FIG. 6 includes the fourth silicide portion 10i and the fifth silicide portion 10j, therefore, the electrical connection between the bit line BL and the transistor is further improved.

According to the storage device of the presently described embodiment, it is possible to provide a storage device with reduced contact resistance.

Third Aspect

According to the third aspect, in one or more embodiments, a storage device includes: a first overall conductive layer extending in a first direction; a first local conductive layer extending in a second direction crossing the first direction; a first transistor portion including a first transistor, and provided between the first overall conductive layer and the first local conductive layer; and a first transistor electrode portion provided between the first local conductive layer and the first transistor portion, wherein the first transistor electrode portion includes a first polycrystalline silicon portion including polycrystalline silicon, a first silicide portion including silicide and provided between the first polycrystalline silicon portion and the first local conductive layer, and a second silicide portion provided between the first polycrystalline silicon portion and the first silicide portion. Here, some redundant description overlapping with the first and second aspects will be omitted.

Figure 7A:
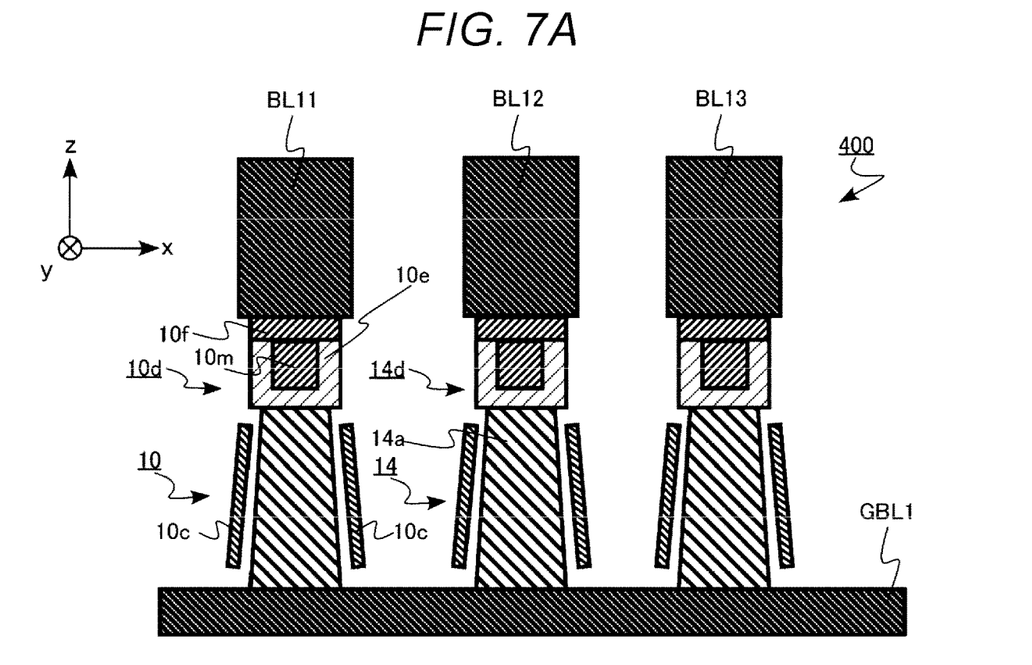
FIG. 7A shows a schematic cross-sectional view of an xz plane according to a third aspect.
Figure 7B:
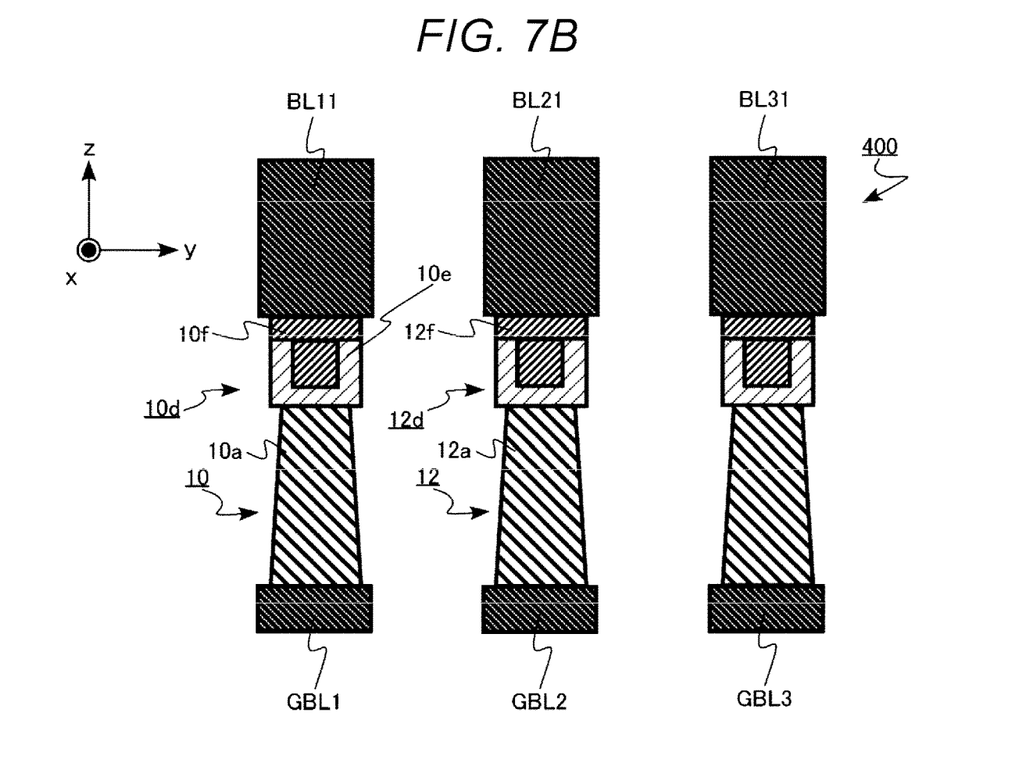
FIG. 7B shows a schematic cross-sectional view of a yz plane according to the third aspect.

FIGS. 7A-7B are schematic cross-sectional views of a main part of a storage device 400 according to the third aspect, FIG. 7A showing a schematic cross-sectional view of the xz plane, FIG. 7B showing a schematic cross-sectional view of the yz plane.

A seventh silicide portion 10m is provided between the first polycrystalline silicon portion 10e and the first silicide portion 10f. Favorable electrical connection between the first polycrystalline silicon portion 10e and the seventh silicide portion 10m is ensured by the seventh silicide portion 10m.

In order to ensure favorable electrical connection between the first polycrystalline silicon portion 10e and the seventh silicide portion 10m, the seventh silicide portion 10m can be covered by the first polycrystalline silicon portion 10e and the first silicide portion 10f.

Figure 8A:
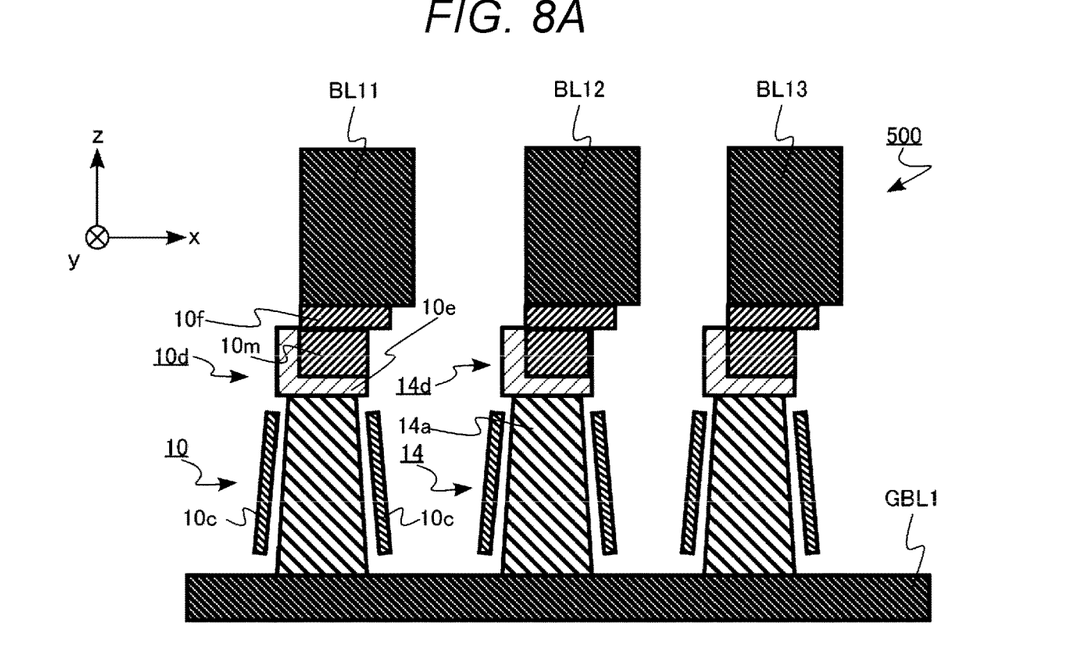
FIG. 8A shows a schematic cross-sectional view of an xz plane of another embodiment of a main part of a storage device according to the third aspect.
Figure 8B:
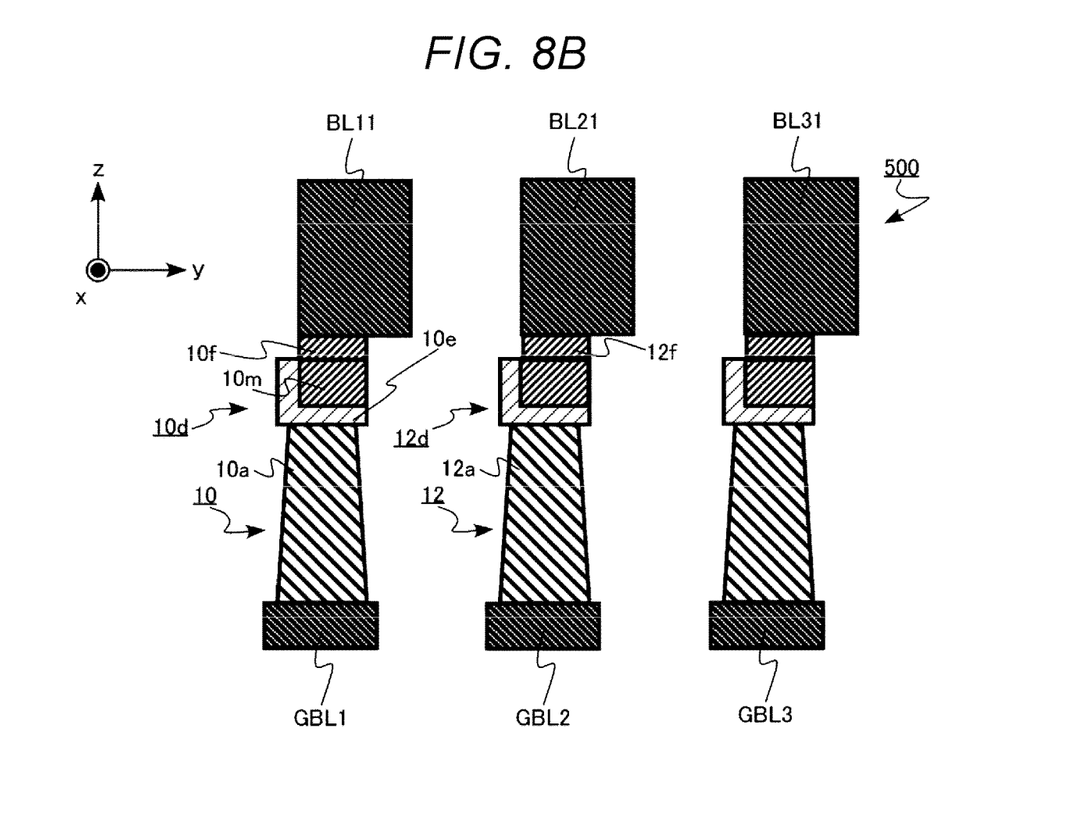
FIG. 8B shows a schematic cross-sectional view of a yz plane of another embodiment of a main part of a storage device according to the third aspect.

FIGS. 8A-8B are schematic cross-sectional views of a main part of a storage device 500 according to another aspect of the third aspect, FIG. 8A showing a schematic cross-sectional view of the xz plane, FIG. 8B showing a schematic cross-sectional view of the yz plane. As shown in FIG. 8, even when the bit line BL and the transistor are misaligned, more favorable electrical connection can be ensured by the seventh silicide portion 10m.

According to the storage device of the presently described embodiments, it is possible to provide a storage device with reduced contact resistance.

As used herein, the terms "about" and "substantially" are used to describe and account for small variations. When used in conjunction with an event or circumstance, the terms "about" and "substantially" can refer to instances in which the event or circumstance occurs precisely as well as instances in which the event or circumstance occurs to a close approximation. For example, when used in conjunction with a numerical value, the terms "about" and "substantially" can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

As used herein, the singular terms "a," "an," and "the" may include plural referents unless the context clearly dictates otherwise. In the description of some embodiments, a component provided "on," "above," or "over" another component can encompass cases where the former component is directly on (e.g., in physical contact with) the latter component, as well as cases where one or more intervening components are located between the former component and the latter component.

While certain embodiments and examples have been described herein, these embodiments and examples have been presented by way of example only, and are not intended to limit the scope of the present disclosure. Indeed, the embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A storage device, comprising:
a transistor portion comprising a transistor and a gate electrode;
a plurality of interlayer insulating films provided above the transistor portion;
a plurality of first conductive layers provided respectively between the plurality of interlayer insulating films;
a second conductive layer extending through the plurality of interlayer insulating films and the plurality of first conductive layers, the second conductive layer having a first end electrically connected to the transistor portion, and a part that extends beyond a portion of the transistor portion; and
a first insulating film provided between the part of the second conductive layer and the gate electrode, wherein the part of the second conductive layer is connected to the first insulating film.

2. The storage device according to claim 1, wherein the transistor portion further comprises a barrier metal layer provided between the transistor and the plurality of interlayer insulating films.

3. The storage device according to claim 2, wherein the part of the second conductive layer extends beyond a part of the barrier metal layer.

4. The storage device according to claim 1, wherein the part of the second conductive layer contacts a side surface of the transistor.

5. The storage device according to claim 1, wherein the part of the second conductive layer extends beyond a part of the barrier metal layer.

6. The storage device according to claim 5, wherein the part of the second conductive layer contacts a side surface of the barrier metal layer.

7. The storage device according to claim 6, wherein the part of the second conductive layer extends beyond the barrier metal layer and contacts a side surface of the transistor.

* * * * *